United States Patent
Lu et al.

(10) Patent No.: US 8,982,641 B2
(45) Date of Patent: Mar. 17, 2015

(54) MEMORY ERASING METHOD AND DRIVING CIRCUIT THEREOF

(75) Inventors: Hsiao-Hua Lu, Chu-Pei (TW); Chih-Ming Kuo, Chu-Pei (TW); Yu-Chun Wang, Chu-Pei (TW)

(73) Assignee: EON Silicon Solution Inc. (TW)

( * ) Notice: Subject to any disclaimer, the term of this patent is extended or adjusted under 35 U.S.C. 154(b) by 189 days.

(21) Appl. No.: 13/540,803

(22) Filed: Jul. 3, 2012

(65) Prior Publication Data

US 2014/0010013 A1    Jan. 9, 2014

(51) Int. Cl.
    *G11C 16/16*    (2006.01)
(52) U.S. Cl.
    USPC ............. 365/185.29; 365/185.26; 365/185.11
(58) Field of Classification Search
    USPC ........................... 365/185.29, 185.26, 185.11
    See application file for complete search history.

(56) References Cited

U.S. PATENT DOCUMENTS

| 6,049,479 | A  | * | 4/2000 | Thurgate et al. | ......... | 365/185.18 |
| 6,876,582 | B2 | * | 4/2005 | Wang et al.     | ............. | 365/185.29 |

* cited by examiner

*Primary Examiner* — Douglas King
(74) *Attorney, Agent, or Firm* — Schmeiser, Olsen & Watts, LLP (57) ABSTRACT

A memory erasing method and a driving circuit thereof are introduced, when cells are selected to be erased, the method includes setting gates of cells which are not selected to be erased and are located at a selected block, drains of all the cells in a selected bank, and the gate of the unselected cells to be floating; supplying a positive voltage to all the sources in a selected bank and their shared P well and N well; and supplying a negative voltage to the gates of the cells located in a selected block and selected to be erased. Accordingly, a positive coupling voltage from P wells is received whenever gates are floating, so as to inhibit erasure of unselected blocks and thereby streamline decoding, thus making it easy to attain further expansion of blocks or banks with a small layout area and partition of sectors in the blocks.

5 Claims, 9 Drawing Sheets

FIG.1

(prior art)

FIG.2

(prior art)

MEMORY ERASING METHOD AND DRIVING CIRCUIT THEREOF

FIELD OF TECHNOLOGY

The present invention relates to NOR flash memory, and more particularly, to a memory erasing method applicable to a NOR flash memory and a driving circuit for implementing the memory erasing method.

BACKGROUND

Due to advancement of semiconductor technology, memory has increasingly great capacity and increasingly high speed. At present, NOR flash memory is widely used in electronic products. NOR memory comprises a plurality of banks each having a plurality of blocks. The blocks each comprise a plurality of cells arranged in columns and rows. In general, the cells of each block share a P well and a N well. According to the prior art, to erase cells of a row in a block, it is necessary to apply an erasing voltage (which is usually a relatively high positive voltage, such as 8V) to the P well and apply a negative voltage (which is usually a relatively high negative voltage, such as −9V) to the gate of the cells of the row, so as to erase data from cells. However, a system power voltage or a positive voltage (usually a relatively low positive voltage, such as VCC or 3V) lower than the erasing voltage has to be applied to the gate of the "not-to-be-erased" cells of the remaining rows in the same block, thereby resulting in erase disturb during an erasure process.

In general, small blocks are relatively insusceptible to erase disturb. However, chip dimensions increases with the quantity of blocks. As a result, application of NOR flash memory is currently restricted to one-time erasure of 4K bits (i.e., a sector) or 64K bits (i.e., a block). The prior art is not effective in eliminating erase disturb. According to the prior art, to reduce erase disturb that occurs to a memory having a specific number of rows, it is necessary to divide the memory into more blocks or sectors. To divide the memory into more blocks or sectors, it requires more power switching decoding circuits and a driving circuit in order to generate a voltage signal; however, in doing so, chip dimensions increase.

Figure 1:
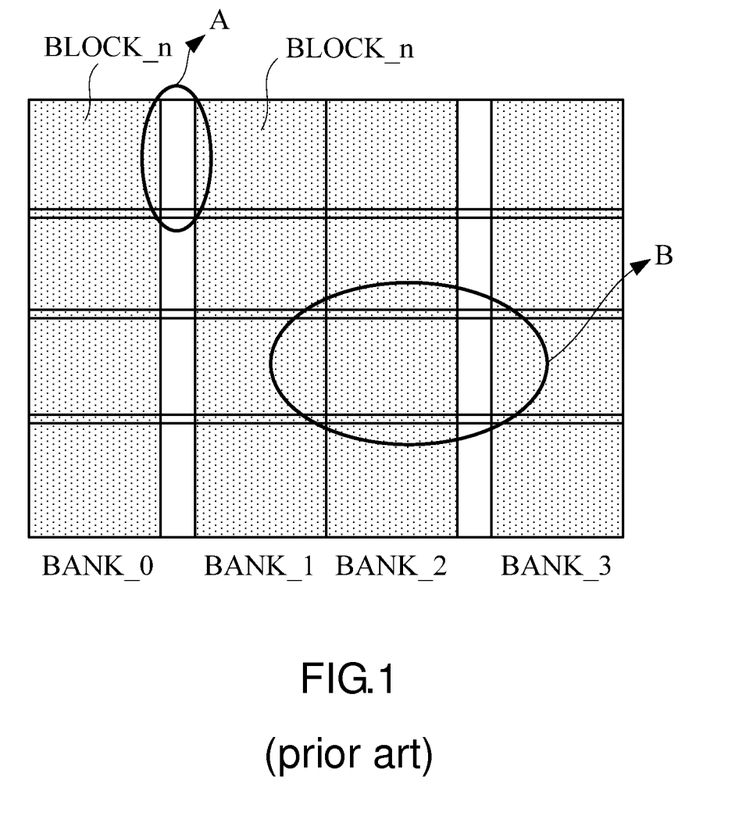
FIG. 1 is a schematic view of conventional arrangement of banks of a flash memory.
Figure 2:
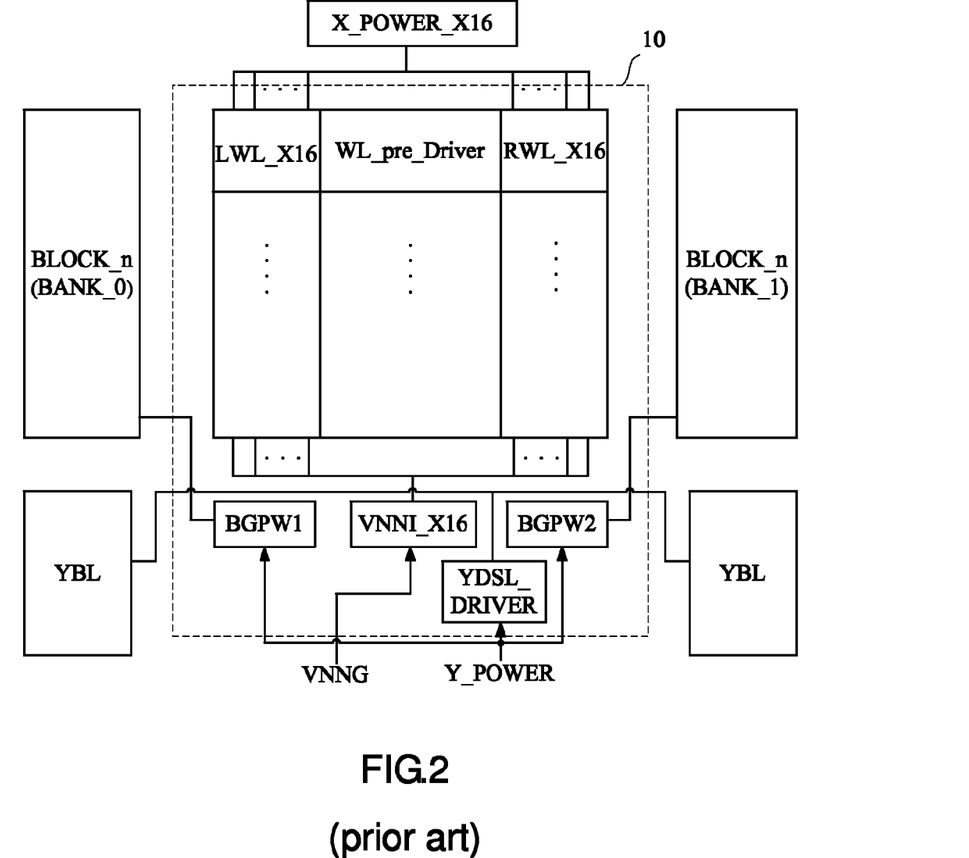
FIG. 2 is a circuit block diagram of a driving circuit of a conventional NOR flash memory, referring to area A of FIG. 1.

Referring to FIG. 1 and FIG. 2, there are shown in FIG. 1 a schematic view of conventional arrangement of banks of a flash memory, and in FIG. 2 a circuit block diagram of a driving circuit of a conventional NOR flash memory, referring to area A of FIG. 1. A conventional NOR flash memory has a plurality of driving circuits. The driving circuit 10 is disposed between two neighboring blocks (such as BLOCK_n) of two neighboring banks (such as BANK_0, BANK_1). The driving circuit 10 comprises a word line driving circuit WL_DRIVER, two block P well voltage supplying circuits BGPW1, BGPW2, 16 negative voltage supplying circuits VNNI_X16, and a bit line driving circuit YDSL_DRIVER. In general, each sector has 4K bits (i.e., each sector has 4K cells), and each block (such as BLOCK_0, BLOCK_1) has 16 sectors (i.e., each block has 64K cells.) In general, the word line driving circuit WL_DRIVER has a plurality of word line preceding drivers WL_pre_Driver. The word line preceding drivers WL_pre_Driver drive 16 left word lines LWL_X16 and 16 right word lines RWL_X16 in order to drive the cells of two neighboring blocks (such as BLOCK_n), respectively.

The two block P well voltage supplying circuits BGPW1, BGPW2 receive a system power Y_POWER for supplying a positive voltage to the P well and the N well of the two neighboring blocks BLOCK_n. The word line driving circuit WL_DRIVER receives 16 power sources X_POWER_X16 from a power switching decoding circuit (not shown) and generates and sends 16 word line driving signals to the gate of a plurality of cells of a plurality of rows. The bit line driving circuit YDSL_DRIVER receives the system power Y_POWER and drives a plurality of bit lines YBL of the two neighboring blocks BLOCK_n. The 16 negative voltage supplying circuits VNNI_X16 each receive a negative voltage VNNG, and then the 16 negative voltage supplying circuits VNNI_X16 generate and send 16 negative voltages to the word line driving circuit WL_DRIVER in accordance with the negative voltage VNNG, to erase a selected word line of 16 sectors of the two blocks BLOCK_n.

To erase a plurality of cells of a row of a sector, the word line driving circuit WL_DRIVER applies a negative voltage to a word line of the row, wherein the word line of the row is connected to the gate of a plurality of cells of the row. In the block to which the cells to be erased belong, a system power voltage is applied to a plurality of word lines of the cells not to be erased. If the block does not have any cells to be erased, a ground voltage (0V) supplied by the word line driving circuit WL_DRIVER will be applied to all the word lines of the block.

As regards a conventional NOR flash memory, the driving circuit 10 is disposed in the space between two neighboring blocks in two neighboring banks, respectively, and the space that accommodates the driving circuit 10 is an elongate space which separates BLOCK_0 and BLOCK_1 and separates BLOCK_2 and BLOCK_3 shown in FIG. 1, respectively. Therefore, to reduce erase disturb, the NOR flash memory must have more blocks or sectors. A plethora of inhibitive voltage circuits and excessive partition of sectors complicate the word line driving circuit. To further expand blocks or banks, it is necessary to allocate a driving circuit of a conventional NOR flash memory repeatedly at the cost of increasing the area occupied.

SUMMARY

It is an objective of the present invention to streamline the decoding process performed by a memory erasing method and a driving circuit thereof, make it easier to further expand blocks or banks with less layout area, and increase partition of sectors in a block.

In order to achieve the above and other objectives, the present invention provides a memory erasing method. When a plurality of cells of a row of a block of a bank is selected to be erased, the memory erasing method comprises the steps of: setting gates of cells which are not selected to be erased and are located at a selected block, drains of all the cells in a selected bank, and the gate of each cell in any unselected block in a selected bank to be floating; supplying a positive voltage to sources of all the cells in a selected bank and a shared P well and N well; and supplying a negative voltage to the gates of the cells which are selected to be erased and located at the row of the selected block.

In order to achieve the above and other objectives, the present invention provides a driving circuit comprising pairs of neighboring banks, wherein a main driving circuit is disposed in two neighboring blocks of a pair of banks, and a secondary driving circuit is disposed in two neighboring blocks of other pairs of banks. The main driving circuit comprises: a global word line driver for receiving a power source from a power switching decoding circuit so as to generate a plurality of global word line signals and reverse global word line signals thereof; two extension first local word line drivers for receiving the global word line signals and reverse global word line signals thereof and receiving another power source from the power switching decoding circuit so as to generate and supply a voltage of the word lines of the two neighboring blocks; a global negative voltage supplying circuit for receiving a reference negative voltage and supplying a negative voltage to the extension first local word line drivers; and a first bit line driving circuit for driving the bit lines of the two neighboring blocks. The secondary driving circuit comprises: an extension second local word line driver for receiving the global word line signals and reverse global word line signals thereof and receiving another power source from the power switching decoding circuit, so as to generate and supply a voltage of the word lines of the neighboring blocks; and a second bit line driving circuit for driving the bit lines of the neighboring blocks.

In conclusion, the present invention provides a memory erasing method and a driving circuit for implementing the memory erasing method such that driving with the method and circuit of the present invention reduces circuit complexity and suppresses erase disturb. The driving circuit of the present invention operates in conjunction with a secondary driving circuit. A plurality of columns and a plurality of rows of a NOR flash memory can be increased by means of the expansion effectuated by the secondary driving circuit, without equalizing the area occupied by a driving circuit disposed between two neighboring blocks of two neighboring banks, so as to reduce circuit complexity greatly and thereby reduce a circuit-occupied area of a chip.

BRIEF DESCRIPTION OF THE DRAWINGS

Objectives, features, and advantages of the present invention are hereunder illustrated with specific embodiments in conjunction with the accompanying drawings, in which.

DETAILED DESCRIPTION

To make it easier to expand a plurality of columns and a plurality of rows of a NOR flash memory and boost the capacity of the NOR flash memory without overly increasing chip dimensions, the present invention provides a memory erasing method and a driving circuit for implementing the memory erasing method, whereby, given a driving circuit of the present invention, a plurality of columns and a plurality of rows of the NOR flash memory can be increased without overly increasing chip dimensions.

Figure 3:
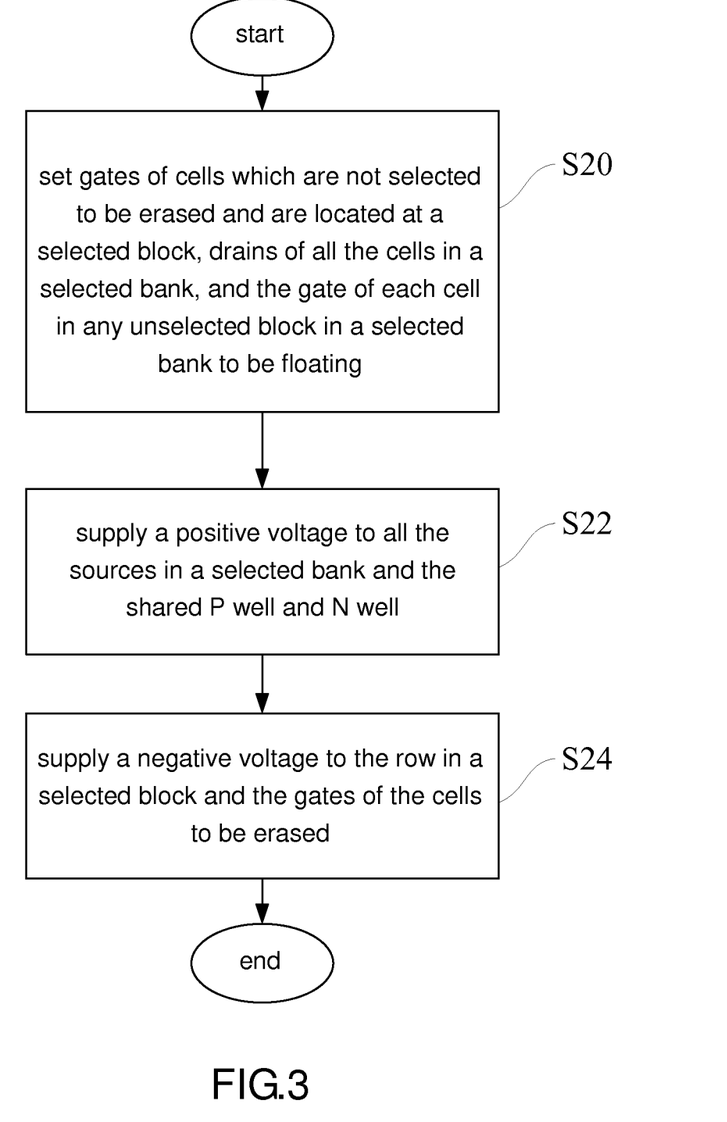
FIG. 3 is a flow chart of a memory erasing method according to an embodiment of the present invention.

Referring to FIG. 3, there is shown a flow chart of a memory erasing method according to an embodiment of the present invention. The NOR flash memory has a plurality of banks. Each bank has a plurality of blocks. Each block has a plurality of cells. The cells are arranged in columns and rows. Each word line is connected to the gates of a plurality of cells of a corresponding one of the rows. Each local bit line is connected to the drains of a plurality of cells of a corresponding one of the columns. The sources of a plurality of cells of every several columns are connected to a global bit line via a plurality of selective transistors.

If a plurality of cells of a row in a block of a bank is selected to be erased, the memory erasing method will be performed on the NOR flash memory. In step S20, the subject matters of descriptions (A), (B), (C) below are set to be floating. (A): the gates in a plurality of cells which is not selected to be erased and is located at a selected block. (B): the drains of all the cells in a selected bank. (C): the gate of each cell in any unselected block in a selected bank.

Afterward, in step S22, a positive voltage (such as 8V) is supplied to the sources of all the cells in each of the blocks of a selected bank, and a positive voltage (such as 8V) is supplied to the shared P well and N well. In step S24, a negative voltage (such as −9V) is supplied to the row in a selected block and the gates of a plurality of cells to be erased. In general, the voltage of the floated gates of a plurality of cells of the unselected rows in the selected block is less than the positive voltage of the P wells (for example, the voltage of the floated gate is 4V approximately). The aforesaid sequence of steps S20, S22 and S24 is not intended to be restrictive of the present invention. Preferably, steps S22 and S24 are performed concurrently. Alternatively, steps S22 and S24 can precede step S20. Alternatively, steps S20, S22 and S24 are performed concurrently.

In addition, the memory erasing method illustrated with FIG. 3 further comprises another step performed prior to steps S20, S22 and related to positioning a driving circuit between two neighboring blocks of two neighboring banks. The driving circuit supplies a negative voltage and sets the gates of a plurality of cells which is not selected to be erased and is located at a selected block to be floating.

Figure 4:
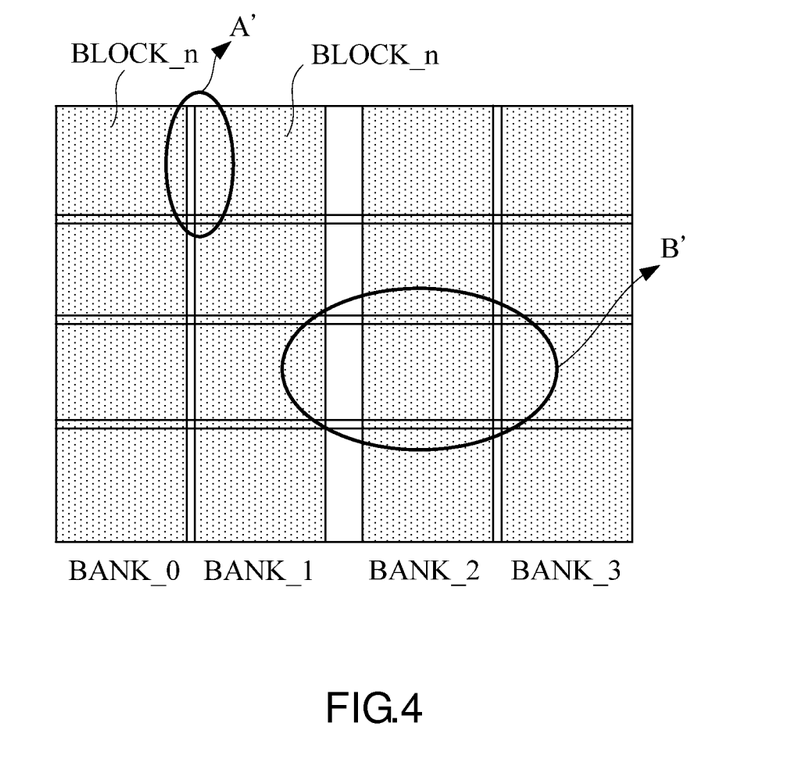
FIG. 4 is a schematic view of arrangement of banks of a flash memory according to an embodiment of the present invention.

Referring to FIG. 4, there is shown a schematic view of arrangement of banks of a flash memory according to an embodiment of the present invention. A secondary driving circuit (local A'), which occupies less circuit area and substitutes for a conventional global word line driver repeatedly replicated, flanks the main driving circuit (occupying almost as much space as a conventional driving circuit does), so as to reduce the required space for accommodating a driving circuit in a conventional flash memory. Therefore, in an embodiment of the present invention, the driving circuit comprises a plurality of neighboring banks, such as a pair of banks BANK_0 and BANK_1, a pair of banks BANK_1 and BANK_2, and a pair of banks BANK_2 and BANK_3. A main driving circuit (having one global word line driver and two extension local word line drivers) is disposed in two neighboring blocks of a pair of banks (BANK_1, BANK_2), whereas a secondary driving circuit (having only one extension local word line driver) is disposed in each of the other pairs of banks (BANK_0 and BANK_1, BANK_1 and BANK_2). As indicated above, in an embodiment of the present invention, one main driving circuit operates in conjunction with a plurality of secondary driving circuits. Each bank is provided with one extension local word line driver and provided with the global word line driver of one main driving circuit for driving all the extension local word line drivers. For example, given four banks, one main driving circuit (having one global word line driver) is required, and four extension local word line drivers (including two extension local word line drivers in the main driving circuit, and the extension local word line drivers in two secondary driving circuits, respectively) are required. Given eight banks, one main driving circuit (having one global word line driver) is required, and eight extension local word line drivers (including two extension local word line drivers in the main driving circuit, and the extension local word line drivers in six secondary driving circuits, respectively) are required.

Figure 5:
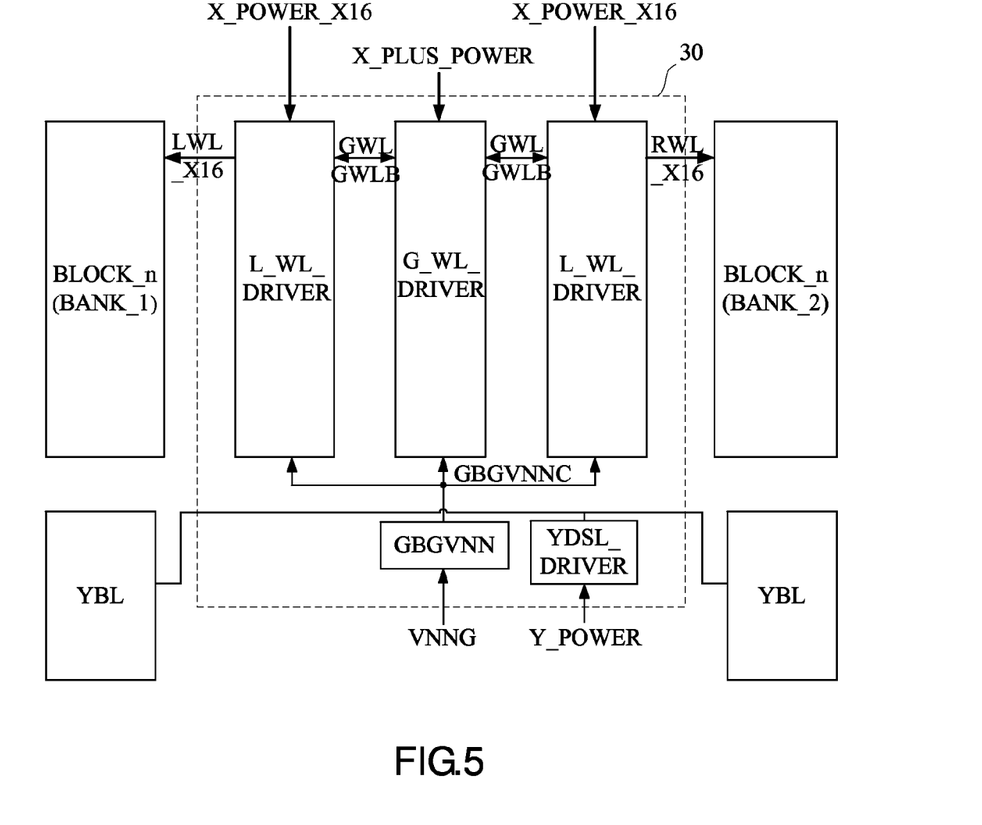
FIG. 5 is a circuit block diagram of a driving circuit for implementing the memory erasing method of FIG. 3 according to an embodiment of the present invention.

Referring to FIG. 5, there is shown a circuit block diagram of a driving circuit for implementing the memory erasing method of FIG. 3 according to an embodiment of the present invention, and the circuit block diagram refers to area B' of FIG. 4. The NOR flash memory comprises a plurality of banks and a plurality of drivers. Each bank has a plurality of blocks. Each block has a plurality of cells. The cells are arranged in columns and rows. Each word line is connected to the gates of a plurality of cells of a corresponding one of the rows. Each local bit line is connected to the drains of a plurality of cells of a corresponding one of the columns. The sources of a plurality of cells in every several columns are connected to one global bit line via a plurality of selective transistors. The driving circuit of the present invention comprises a main driving circuit 30 and a secondary driving circuit 40.

Referring to FIG. 5, the main driving circuit 30 is disposed between two neighboring blocks BLOCK_n, BLOCK_n (such as BLOCK_1 of BANK_1, and BLOCK_1 of BANK_2) corresponding in position to two neighboring banks (such as BANK_1, BANK_2 shown in FIG. 4), respectively. The main driving circuit 30 comprises a global word line driver G_WL_DRIVER, two extension local word line drivers L_WL_DRIVER, a global negative voltage supplying circuit GBGVNN, and a bit line driving circuit YDSL_DRIVER. The two extension local word line drivers L_WL_DRIVER receive global word line signals GWL and reverse global word line signals GWLB, and receive two power sources X_POWER_X16 from a power switching decoding circuit (not shown), so as to generate and supply a voltage to a plurality of word lines LWLX_16, RWLX_16 of the two neighboring blocks. The global negative voltage supplying circuit GBGVNN receives a reference negative voltage VNNG and supplies the negative voltage GBGVNNC to the extension local word line drivers L_WL_DRIVER and the global word line driver G_WL_DRIVER. The bit line driving circuit YDSL_DRIVER receives a system voltage Y_POWER and drives a plurality of bit lines YBL of the two neighboring blocks BLOCK_1, BLOCK_2.

The global word line driver G_WL_DRIVER receives another power source X_PLUS_POWER from a power switching decoding circuit, so as to generate and send the global word line signals GWL and reverse global word line signals GWLB to the two extension local word line drivers L_WL_DRIVER. The purpose of an embodiment of the present invention is to increase the blocks in the same bank of the NOR flash memory, by replicating the extension local word line drivers L_WL_DRIVER and positioning the secondary driving circuit 40 (shown in FIG. 6) between two neighboring blocks BLOCK_n, BLOCK_n of every two neighboring banks BANK_0, BANK_1, wherein the secondary driving circuit 40 does not have the global word line driver G_WL_DRIVER.

Figure 6:
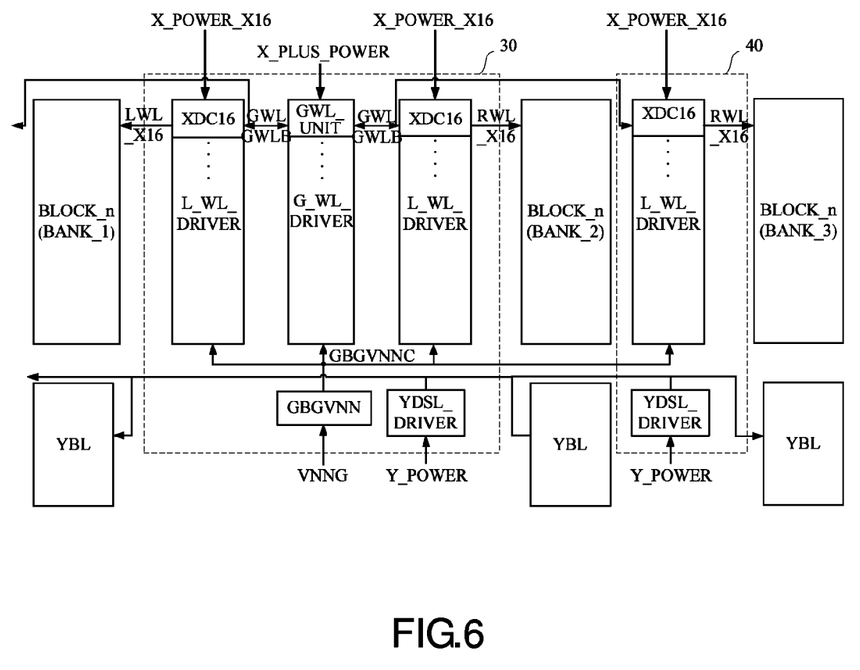
FIG. 6 is a circuit block diagram of the driving circuit for implementing the memory erasing method of FIG. 3 according to another embodiment of the present invention.

Referring to FIG. 6, there is shown a circuit block diagram of the driving circuit for implementing the memory erasing method of FIG. 3 according to another embodiment of the present invention, wherein FIG. 6 refers to local B' of FIG. 4.

Given the structure of the embodiment of the present invention illustrated with FIG. 5, to increase the banks of the NOR flash memory, it is only necessary to replicate and position the secondary driving circuit 40 between two neighboring blocks BLOCK_n, BLOCK_n (such as BLOCK_1 of BANK_1 and BLOCK_1 of BANK_0) of two neighboring banks BANK_0, BANK_1 (shown in FIG. 4), respectively. The extension local word line drivers L_WL_DRIVER between the two neighboring blocks BLOCK_n, BLOCK_n of the two neighboring banks BANK_0, BANK_1 not only receive the negative voltage GBGVNNC supplied by the global negative voltage supplying circuit GBGVNN but also receive the global word line signals GWL and reverse global word line signals GWLB thereof sent from the global word line driver G_WL_DRIVER. Each bank receives a bank negative voltage signal BKVNN (not shown) for supplying a zero voltage or a negative voltage to enable related operation. Compared with a driver of a conventional NOR flash memory, the main driving circuit 30 and the secondary driving circuit 40 only require one global negative voltage supplying circuit GBGVNN, the relatively less global word line driver G_WL_DRIVER and the extension local word line driver L_WL_DRIVER, and thus reduce the dimensions of the driving circuit in its entirety greatly. Given the structure of the embodiments of the present invention, it is easy to achieve expansion of more blocks or banks with a relatively small layout area. The quantity of the extension local word line drivers L_WL_DRIVER which can be coupled with the main driving circuit 30 is determined by the driving capability, a load, and the operation speed of the global word line driver G_WL_DRIVER, which falls within the scope of the prior art, and therefore persons skilled in the art can easily choose the appropriate global word line driver G_WL_DRIVER.

Referring to FIG. 6, each extension local word line driver L_WL_DRIVER has 64 local word line driving units XDC16. The local word line driving units XDC16 each receive a power source X_POWER_X16, a negative voltage GBGVNNC, a global word line signal GWL and reverse global word line signal GWLB thereof, so as to generate a voltage of the 16 word lines. Similarly, the global word line driver G_WL_DRIVER comprises 64 global word line driving units GWL_UNIT. The global word line driving units GWL_UNIT each correspond in position to the two local word line driving units XDC16, thereby generating and sending the global word line signals GWL and reverse global word line signals GWLB thereof to the two local word line driving units XDC16, respectively. In practice, the local word line driving units XDC16 have three series-connected transistors. However, when the breakdown voltage of the first transistor is high enough, the local word line driving units XDC16 can have only two series-connected transistors or even only one single transistor.

If a plurality of cells of a row of a block in one of the two neighboring banks BANK_0, BANK_1 is selected to be erased, a corresponding one of the extension local word line drivers L_WL_DRIVER will apply a negative voltage to the word lines corresponding to the gates of a plurality of cells (selected to be erased) in the row of the block, and the corresponding extension local word line driver L_WL_DRIVER will float the gates of a plurality of cells which is not selected to be erased and is located at the selected block. A positive voltage is not only applied to the sources of all the cells in a selected bank but also applied to the shared P well and N well. The drains of all the cells in a selected bank and the gates of a plurality of cells of each unselected block in a selected bank are set to be floating.

The global word line driver G_WL_DRIVER generates and sends global word line signals GWL and reverse global word line signals GWLB to each extension local word line driver L_WL_DRIVER in accordance with the power source X_PLUS_POWER from a power switching decoding circuit, so as to achieve the purpose of word line global decoding. Furthermore, the P wells of each bank are collectively connected to a positive voltage, so as to reduce the complexity of the necessity to generate a positive voltage with regard to the P wells of each sector.

Figure 7A:
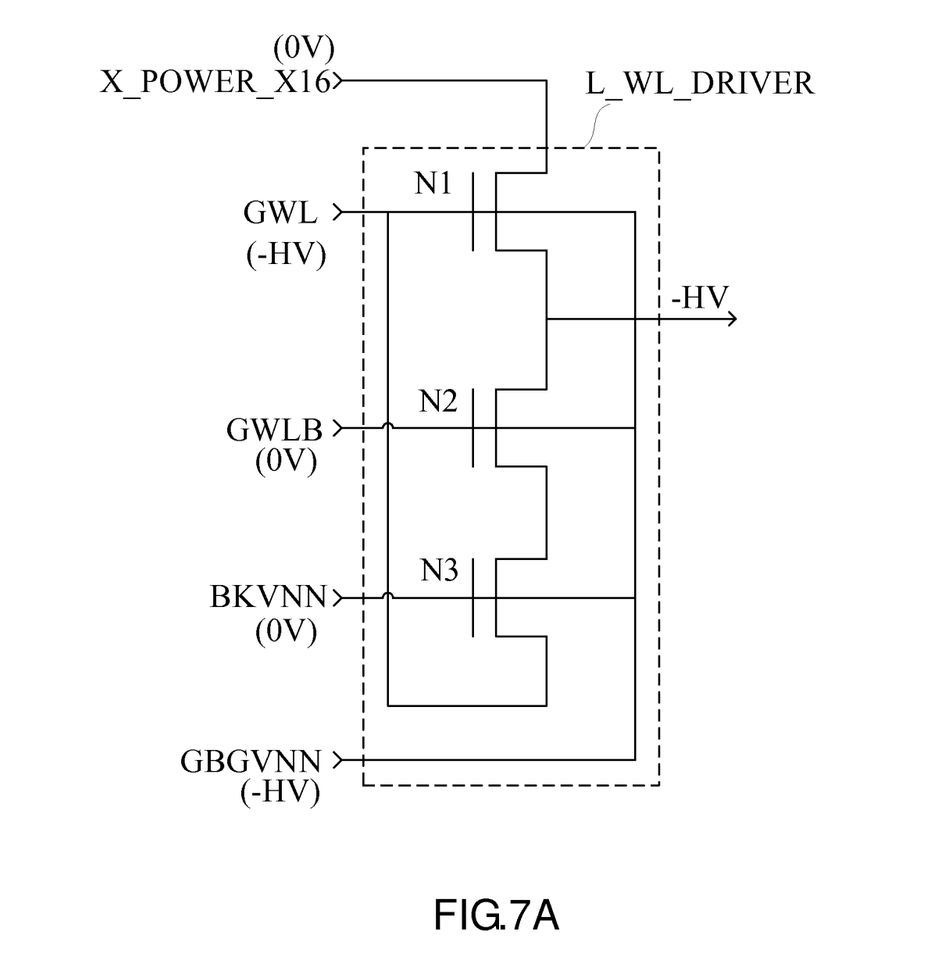
FIGS. 7A, 7B, 7C are schematic views of operation of an extension local word line driver in different conditions during an erasure process according to an embodiment of the present invention.
Figure 7B:
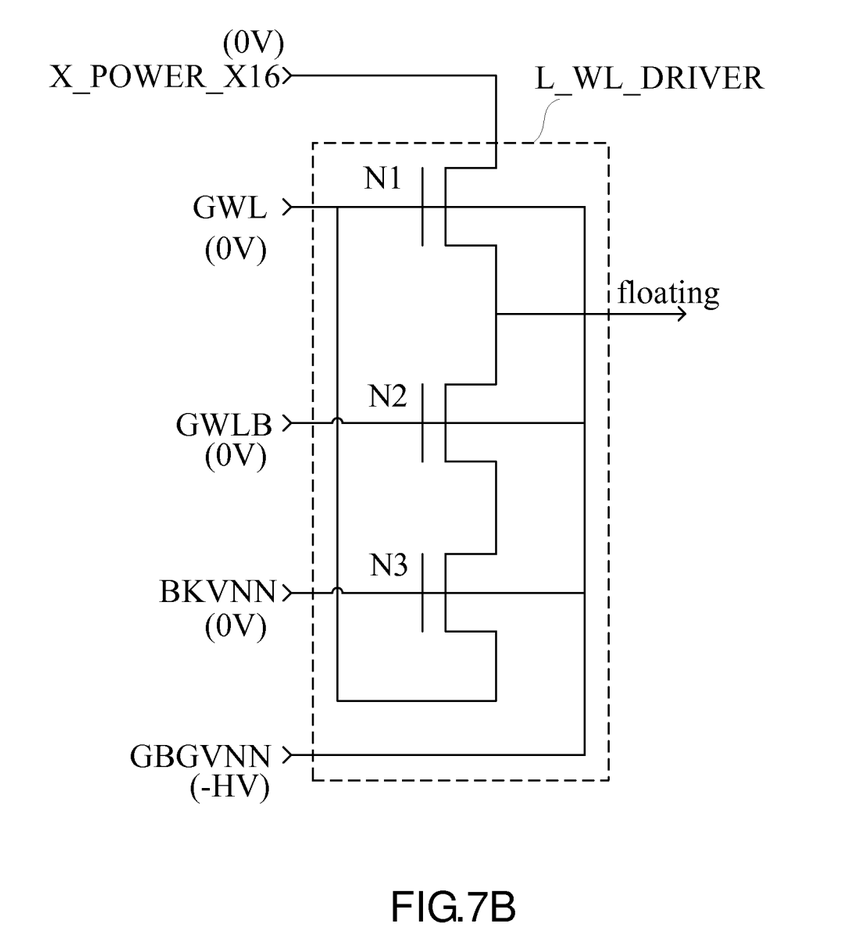
Figure 7C:
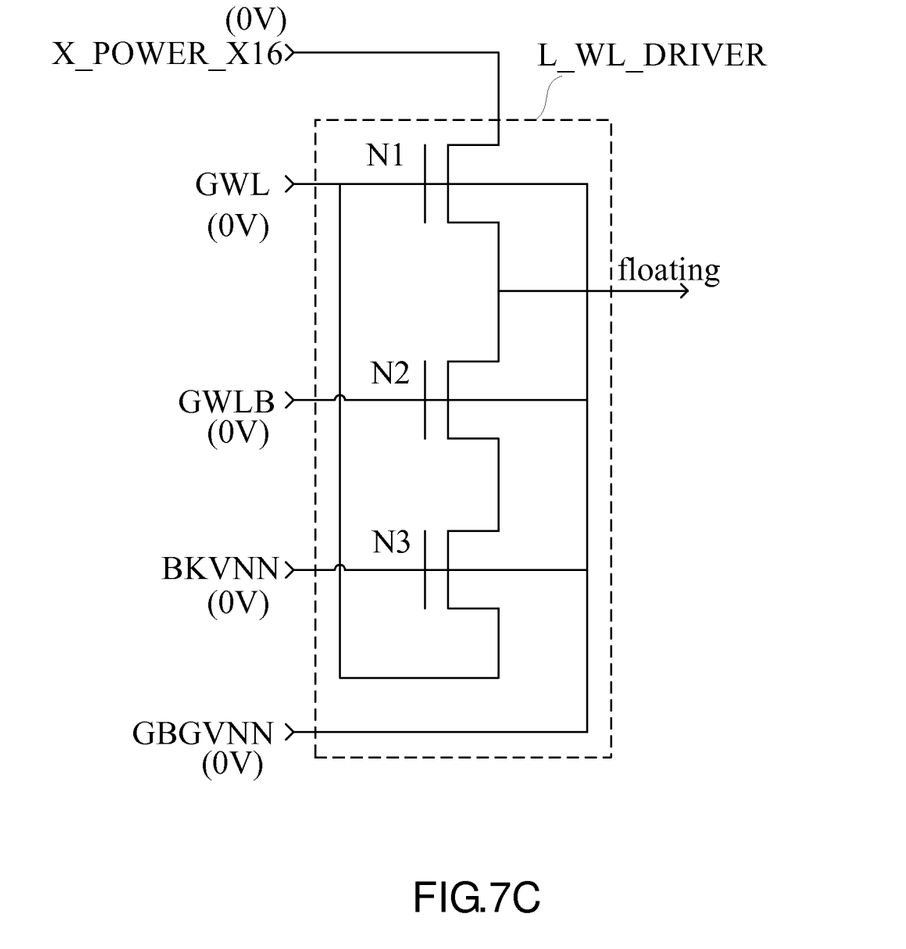

Referring to FIGS. 7A, 7B, 7C, there are shown schematic views of operation of an extension local word line driver in different conditions during an erasure process according to an embodiment of the present invention, depicting how the cells of a row of a block of a bank are selectively erased.

FIG. 7A shows that an extension local word line driver applies a voltage to a word line of the cells which are selected to be erased and located at a row of a selected block, wherein the power source X_POWER_X16 supplies a voltage to the extension local word line driver L_WL_DRIVER selected, so as to determine the word line of the cells to be erased. In this situation, the global word line signals GWL are operated under a negative voltage (−HV), such as −9V, whereas the reverse global word line signals GWLB and the bank negative voltage signal BKVNN are operated under a ground voltage (zero voltage), and the global negative voltage supplying circuit GBGVNN is operated under an output voltage, that is, a negative voltage GBGVNNC. As regards the P wells (not shown), a positive voltage is applied to them according to the prior art. Accordingly, as regards the word lines of the cells to be erased, the corresponding extension local word line driver L_WL_DRIVER supplies a negative voltage to the gates in the word lines of the cells to be erased.

FIG. 7B shows that an extension local word line driver applies a voltage to a word line of the cells which are not selected to be erased and are located at a selected block, wherein the power source X_POWER_X16 supplies a voltage to the extension local word line driver L_WL_DRIVER selected, so as to determine the word line of the cells not to be erased. In this situation, the global word line signals GWL are operated under a negative voltage (−HV), such as −9V, whereas the reverse global word line signals GWLB and the bank negative voltage signal BKVNN are operated under a ground voltage (zero voltage), and the global negative voltage supplying circuit GBGVNN is operated under an output voltage, that is, a negative voltage GBGVNNC. As regards the P wells (not shown), a positive voltage is applied to them according to the prior art. Accordingly, as regards the word lines of the cells not to be erased, the corresponding extension local word line driver L_WL_DRIVER supplies an inhibit voltage to the gates in the word lines of the cells not to be erased, such that the gates in this situation are set to be floating.

FIG. 7C shows that an extension local word line driver applies a voltage to an unselected block in a selected bank, wherein the power source X_POWER_X16 supplies a voltage to the extension local word line driver L_WL_DRIVER selected, so as to determine the word line of the cells of the unselected block. In this situation, the global word line signals GWL, reverse global word line signals GWLB, BKVNN, and global negative voltage supplying circuit GBGVNN are operated under a ground voltage (zero voltage). As regards the P wells (not shown), a positive voltage is applied to them according to the prior art. Accordingly, as regards the word lines of the cells of the unselected block in the selected bank, the corresponding extension local word line driver L_WL_DRIVER supplies an inhibit voltage to the gates in the word lines of the cells not to be erased, such that the gates in this situation are set to be floating. Similarly, in this situation, a voltage is applied to the drains of all the cells in the selected bank in the same way as depicted in FIG. 7C, such that the drains in this situation are also set to be floating.

Referring to FIGS. 7A, 7B, 7C, although the extension local word line driver L_WL_DRIVER is exemplified by three transistors N1, N2, N3, such as n-type transistors, persons skilled in the art understand that the transistors serve an illustrative purpose such that any other circuits capable of enabling the aforesaid signal operation are applicable to the present invention without departing from the scope of the present invention.

In conclusion, the present invention provides a memory erasing method and a driving circuit for implementing the memory erasing method, whereby a positive coupling voltage from P wells is received whenever gates are floating, so as to inhibit erasure of unselected blocks and thereby streamline decoding, thus making it easy to attain further expansion of blocks or banks with a small layout area and partition of sectors in the blocks. As disclosed in the present invention, with a main driving circuit and a secondary driving circuit operating in conjunction therewith, a plurality of columns and a plurality of rows of a NOR flash memory can be increased by means of the expansion of the extension local word line driver L_WL_DRIVER without replicating the global word line driver G_WL_DRIVER repeatedly, so as to reduce circuit complexity greatly, reduce a circuit-occupied area of a chip, and suppress erase disturb efficiently.

The present invention is disclosed above by preferred embodiments. However, persons skilled in the art should understand that the preferred embodiments are illustrative of the present invention only, but should not be interpreted as restrictive of the scope of the present invention. Hence, all equivalent modifications and replacements made to the aforesaid embodiments should fall within the scope of the present invention. Accordingly, the legal protection for the present invention should be defined by the appended claims.

What is claimed is:

1. A memory erasing method, configured for selectively erasing a plurality of cells of a row of a block of a bank, the memory erasing method comprising the steps of:
    setting gates of cells which are not selected to be erased and are located at a selected block, drains of all the cells in a selected bank, and the gate of each cell in any unselected block in a selected bank to be floating;
    supplying a positive voltage to sources of all the cells in a selected bank and a shared P well and N well; and
    supplying a negative voltage to the gates of the cells which are selected to be erased and located at the row of the selected block
    wherein the method is implemented by a driving circuit, applicable to a NOR flash memory, the driving circuit comprising pairs of neighboring banks, wherein a main driving circuit is disposed in two neighboring blocks of a pair of banks, and a secondary driving circuit is disposed in two neighboring blocks of other pairs of banks, the secondary driving circuit comprising:
    an extension second local word line driver for receiving a plurality of global word line signals and reverse global word line signals thereof generated from the main driving circuit and generating a voltage to be supplied to a word line of the two blocks adjacent to the extension second local word line driver; and
    a second bit line driving circuit for driving a bit line of the two blocks adjacent to the extension second local word line driver.

2. The driving circuit of claim 1, wherein the main driving circuit comprises:
- a global word line driver for generating the global word line signals and reverse global word line signals thereof;
- two extension first local word line drivers for receiving the global word line signals and reverse global word line signals thereof, so as to generate a voltage to be supplied to a word line of the two blocks adjacent to the extension first local word line drivers;
- a global negative voltage supplying circuit for receiving a reference negative voltage and supplying a negative voltage to the two extension first local word line drivers; and
- a first bit line driving circuit for driving a bit line of the two blocks adjacent to the extension first local word line drivers.

3. A driving circuit, applicable to a NOR flash memory having a plurality of banks, the banks each having a plurality of blocks, the blocks each having a plurality of cells, said two neighboring banks being paired, the cells being arranged in columns and rows, a word line being connected to gates of the cells of a corresponding one of the rows, and a local bit line being connected to drains of the cells of a corresponding one of the columns, wherein sources of the cells of every several columns are connected to a global bit line via a plurality of selective transistors, the driving circuit comprising a main driving circuit and a secondary driving circuit, the main driving circuit being disposed in two neighboring blocks of a pair of two neighboring banks, the secondary driving circuit being disposed in two neighboring blocks of each of other pairs of two neighboring banks, the secondary driving circuit comprising:
- an extension second local word line driver for receiving a plurality of global word line signals and reverse global word line signals thereof generated from the main driving circuit and generating a voltage to be supplied to the word line of the two blocks adjacent to the extension second local word line driver; and
- a second bit line driving circuit for driving the bit line of the two blocks adjacent to the extension second local word line driver.

4. The driving circuit of claim 3, wherein the main driving circuit comprises:
- a global word line driver for generating the global word line signals and reverse global word line signals thereof;
- two extension first local word line drivers for receiving the global word line signals and reverse global word line signals thereof and generating a voltage to be supplied to a word line of the two blocks adjacent to the extension first local word line drivers;
- a global negative voltage supplying circuit for receiving a reference negative voltage and supplying a negative voltage to the two extension first local word line drivers; and
- a first bit line driving circuit for driving a bit line of the two blocks adjacent to the extension first local word line drivers.

5. A driving circuit for implementing the memory erasing method, applicable to a NOR flash memory, the driving circuit comprising pairs of neighboring banks, wherein a main driving circuit is disposed in two neighboring blocks of a pair of banks, and a secondary driving circuit is disposed in two neighboring blocks of other pairs of banks, the secondary driving circuit comprising:
- an extension second local word line driver for receiving a plurality of global word line signals and reverse global word line signals thereof generated from the main driving circuit and generating a voltage to be supplied to a word line of the two blocks adjacent to the extension second local word line driver; and
- a second bit line driving circuit for driving a bit line of the two blocks adjacent to the extension second local word line driver;
- wherein the memory erasing method, configured for selectively erasing a plurality of cells of a row of a block of a bank, the memory erasing method comprising the steps of:
    - setting gates of cells which are not selected to be erased and are located at a selected block, drains of all the cells in a selected bank, and the gate of each cell in any unselected block in a selected bank to be floating;
    - supplying a positive voltage to sources of all the cells in a selected bank and a shared P well and N well; and
    - supplying a negative voltage to the gates of the cells which are selected to be erased and located at the row of the selected block.

* * * * *